(12) United States Patent
Fitzgerald

(10) Patent No.: US 7,250,359 B2
(45) Date of Patent: Jul. 31, 2007

(54) CONTROLLING THREADING DISLOCATION DENSITIES IN GE ON SI USING GRADED GESI LAYERS AND PLANARIZATION

(75) Inventor: Eugene A. Fitzgerald, Windham, NH (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/022,689

(22) Filed: Dec. 17, 2001

(65) Prior Publication Data

US 2002/0084000 A1  Jul. 4, 2002

Related U.S. Application Data

(60) Continuation of application No. 09/712,604, filed on Nov. 14, 2000, now abandoned, which is a continuation of application No. 09/265,016, filed on Mar. 9, 1999, now Pat. No. 6,291,321, which is a division of application No. 09/103,672, filed on Jun. 23, 1998, now Pat. No. 6,107,653.

(60) Provisional application No. 60/050,602, filed on Jun. 24, 1997, provisional application No. 60/059,765, filed on Sep. 16, 1997.

(51) Int. Cl.
*H01L 21/20* (2006.01)
(52) U.S. Cl. .................. 438/494; 438/497; 438/500
(58) Field of Classification Search ................ 438/481, 438/500, 507, 690, 691, 692, 760, 938, 959, 438/977, 757, 751, 753, 740, 745, 494, 497
See application file for complete search history.

(56) References Cited

U.S. PATENT DOCUMENTS

| | | | |
|---|---|---|---|
| 4,010,045 A | 3/1977 | Ruehrwein | |
| 4,710,788 A | 12/1987 | Dambkes et al. | |
| 4,969,031 A * | 11/1990 | Kobayashi et al. | 257/64 |
| 4,987,462 A | 1/1991 | Kim et al. | |
| 4,990,979 A | 2/1991 | Otto | |
| 4,997,776 A | 3/1991 | Harame et al. | 437/31 |
| 5,013,681 A | 5/1991 | Godbey et al. | |
| 5,155,571 A | 10/1992 | Wang et al. | |
| 5,166,084 A | 11/1992 | Pfiester | |
| 5,177,583 A | 1/1993 | Endo et al. | 257/190 |
| 5,202,284 A | 4/1993 | Kamins et al. | |
| 5,207,864 A | 5/1993 | Bhat et al. | |
| 5,208,182 A | 5/1993 | Narayan et al. | |
| 5,212,110 A | 5/1993 | Pfiester et al. | |
| 5,221,413 A | 6/1993 | Brasen et al. | |
| 5,240,876 A | 8/1993 | Gaul et al. | |
| 5,241,197 A | 8/1993 | Murakami et al. | |
| 5,250,445 A * | 10/1993 | Bean et al. | |
| 5,285,086 A | 2/1994 | Fitzgerald, Jr. | |
| 5,291,439 A | 3/1994 | Kauffmann et al. | |
| 5,298,452 A | 3/1994 | Meyerson | 437/81 |
| 5,310,451 A | 5/1994 | Tejwani et al. | |
| 5,316,958 A | 5/1994 | Meyerson | |
| 5,346,848 A | 9/1994 | Grupen-Shemansky et al. | |
| 5,374,564 A | 12/1994 | Bruel | |
| 5,399,522 A | 3/1995 | Ohori | |
| 5,413,679 A | 5/1995 | Godbey | |
| 5,424,243 A | 6/1995 | Takasaki | |
| 5,426,069 A | 6/1995 | Selvakumar et al. | |
| 5,426,316 A | 6/1995 | Mohammad | |
| 5,442,205 A | 8/1995 | Brasen et al. | |
| 5,461,243 A | 10/1995 | Ek et al. | |
| 5,461,250 A * | 10/1995 | Burghartz et al. | 257/347 |
| 5,462,883 A | 10/1995 | Dennard et al. | |
| 5,476,813 A | 12/1995 | Naruse | |
| 5,479,033 A | 12/1995 | Baca et al. | |
| 5,484,664 A | 1/1996 | Kitahara et al. | |
| 5,523,243 A | 6/1996 | Mohammad | |
| 5,523,592 A | 6/1996 | Nakagawa et al. | |
| 5,534,713 A * | 7/1996 | Ismail et al. | 257/24 |
| 5,536,361 A | 7/1996 | Kondo et al. | |
| 5,540,785 A | 7/1996 | Dennard et al. | |
| 5,548,128 A | 8/1996 | Soref et al. | |
| 5,572,043 A | 11/1996 | Shimizu et al. | |
| 5,596,527 A | 1/1997 | Tomioka et al. | |
| 5,607,876 A | 3/1997 | Biegelsen et al. | |
| 5,617,351 A | 4/1997 | Bertin et al. | |
| 5,630,905 A | 5/1997 | Lynch et al. | 438/507 |
| 5,659,187 A | 8/1997 | Legoues et al. | 257/190 |
| 5,683,934 A | 11/1997 | Candelaria | |

| | | | | | | |
|---|---|---|---|---|---|---|
| 5,698,869 A | 12/1997 | Yoshimi et al. | | 6,420,937 B1 | 7/2002 | Akatsuka et al. |
| 5,714,777 A * | 2/1998 | Ismail et al. ............... 257/263 | | 6,425,951 B1 | 7/2002 | Chu et al. |
| 5,728,623 A | 3/1998 | Mori | | 6,429,061 B1 | 8/2002 | Rim |
| 5,739,567 A | 4/1998 | Wong | | 6,489,639 B1 | 12/2002 | Hoke et al. |
| 5,759,898 A | 6/1998 | Ek et al. | | 6,521,041 B2 | 2/2003 | Wu et al. |
| 5,777,347 A | 7/1998 | Bartelink | | 6,524,935 B1 | 2/2003 | Canaperi et al. |
| 5,786,612 A | 7/1998 | Otani et al. | | 6,555,839 B2 | 4/2003 | Fitzgerald |
| 5,786,614 A | 7/1998 | Chuang et al. | | 6,573,126 B2 * | 6/2003 | Cheng et al. ............... 438/149 |
| 5,792,679 A | 8/1998 | Nakato | | 6,583,015 B2 | 6/2003 | Fitzgerald et al. |
| 5,808,344 A | 9/1998 | Ismail et al. | | 6,591,321 B1 * | 7/2003 | Arimilli et al. ............ 710/110 |
| 5,847,419 A | 12/1998 | Imai et al. | | 6,593,191 B2 | 7/2003 | Fitzgerald |
| 5,877,070 A | 3/1999 | Goesele et al. | | 6,597,016 B1 * | 7/2003 | Yuki et al. .................... 257/77 |
| 5,891,769 A | 4/1999 | Liaw et al. ................. 438/167 | | 6,602,613 B1 * | 8/2003 | Fitzgerald .................. 428/641 |
| 5,906,708 A | 5/1999 | Robinson et al. | | 6,603,156 B2 | 8/2003 | Rim |
| 5,906,951 A * | 5/1999 | Chu et al. ................... 438/751 | | 6,646,322 B2 | 11/2003 | Fitzgerald |
| 5,912,479 A | 6/1999 | Mori et al. | | 6,674,150 B2 * | 1/2004 | Takagi et al. ............... 257/593 |
| 5,937,274 A * | 8/1999 | Kondow et al. ............. 438/47 | | 6,677,192 B1 | 1/2004 | Fitzgerald |
| 5,943,560 A | 8/1999 | Chang et al. | | 6,689,671 B1 * | 2/2004 | Yu et al. ..................... 438/486 |
| 5,963,817 A | 10/1999 | Chu et al. | | 6,703,144 B2 * | 3/2004 | Fitzgerald .................. 428/641 |
| 5,966,622 A | 10/1999 | Levine et al. | | 6,703,688 B1 | 3/2004 | Fitzergald |
| 5,998,807 A | 12/1999 | Lustig et al. | | 6,713,326 B2 * | 3/2004 | Cheng et al. ............... 438/149 |
| 6,013,134 A | 1/2000 | Chu et al. | | 6,750,130 B1 * | 6/2004 | Fitzgerald .................. 438/607 |
| 6,033,974 A | 3/2000 | Henley et al. | | 6,784,101 B1 * | 8/2004 | Yu et al. ..................... 438/666 |
| 6,033,995 A | 3/2000 | Muller | | 6,803,777 B2 * | 10/2004 | Pfaff et al. .................. 324/752 |
| 6,051,511 A * | 4/2000 | Thakur et al. .............. 438/791 | | 6,805,744 B2 * | 10/2004 | Kim et al. ..................... 117/94 |
| 6,058,044 A | 5/2000 | Sugiura et al. | | 6,876,010 B1 * | 4/2005 | Fitzgerald .................. 257/191 |
| 6,059,895 A * | 5/2000 | Chu et al. ................. 148/33.1 | | 7,081,410 B2 * | 7/2006 | Fitzgerald .................. 438/692 |
| 6,074,919 A | 6/2000 | Gardner et al. | | 2001/0003364 A1 | 6/2001 | Sugawara et al. |
| 6,096,590 A | 8/2000 | Chan et al. | | 2002/0043660 A1 | 4/2002 | Yamazaki et al. |
| 6,103,559 A | 8/2000 | Gardner et al. | | 2002/0052084 A1 | 5/2002 | Fitzgerald |
| 6,107,653 A * | 8/2000 | Fitzgerald .................. 257/191 | | 2002/0084000 A1 * | 7/2002 | Fitzgerald .................. 148/33.2 |
| 6,111,267 A | 8/2000 | Fischer et al. | | 2002/0096717 A1 | 7/2002 | Chu et al. |
| 6,117,750 A | 9/2000 | Bensahel et al. | | 2002/0100942 A1 | 8/2002 | Fitzgerald et al. |
| 6,130,453 A | 10/2000 | Mei et al. | | 2002/0123167 A1 | 9/2002 | Fitzgerald |
| 6,133,799 A | 10/2000 | Favors, Jr. et al. | | 2002/0123183 A1 | 9/2002 | Fitzgerald |
| 6,140,687 A | 10/2000 | Shimomura et al. | | 2002/0123197 A1 | 9/2002 | Fitzgerald et al. |
| 6,143,636 A | 11/2000 | Forbes et al. | | 2002/0125471 A1 | 9/2002 | Fitzgerald et al. |
| 6,153,495 A | 11/2000 | Kub et al. | | 2002/0125497 A1 | 9/2002 | Fitzgerald |
| 6,154,475 A | 11/2000 | Soref et al. | | 2003/0003679 A1 | 1/2003 | Doyle et al. |
| 6,160,303 A | 12/2000 | Fattaruso | | 2003/0077867 A1 | 4/2003 | Fitzgerald |
| 6,162,688 A | 12/2000 | Gardner et al. | | 2004/0262631 A1 * | 12/2004 | Fitzgerald .................. 257/191 |
| 6,184,111 B1 | 2/2001 | Henley et al. | | 2007/0007508 A1 * | 1/2007 | Mears et al. .................. 257/18 |
| 6,191,007 B1 | 2/2001 | Matsui et al. | | 2007/0010040 A1 * | 1/2007 | Mears et al. .................. 438/48 |
| 6,191,432 B1 | 2/2001 | Sugiyama et al. | | 2007/0012909 A1 * | 1/2007 | Mears et al. .................. 257/15 |
| 6,194,722 B1 | 2/2001 | Fiorini et al. | | 2007/0012910 A1 * | 1/2007 | Mears et al. .................. 257/15 |
| 6,204,529 B1 | 3/2001 | Lung et al. | | 2007/0012912 A1 * | 1/2007 | Mears et al. .................. 257/18 |
| 6,207,977 B1 | 3/2001 | Augusto | | 2007/0015344 A1 * | 1/2007 | Mears et al. ................ 438/478 |
| 6,210,988 B1 | 4/2001 | Howe et al. | | | | |
| 6,218,677 B1 | 4/2001 | Broekaert | | | FOREIGN PATENT DOCUMENTS | |
| 6,232,138 B1 | 5/2001 | Fitzgerald et al. | | DE | 41 01 167 | 7/1992 |
| 6,235,567 B1 | 5/2001 | Huang | | EP | 0 514 018 A1 | 4/1992 |
| 6,242,324 B1 | 6/2001 | Kub et al. | | EP | 0 587 520 | 3/1994 |
| 6,249,022 B1 | 6/2001 | Lin et al. | | EP | 0 838 858 | 4/1994 |
| 6,251,755 B1 | 6/2001 | Furukawa et al. | | EP | 0 683 522 | 11/1995 |
| 6,261,929 B1 | 7/2001 | Gehrke et al. | | EP | 0 828 296 | 3/1998 |
| 6,266,278 B1 | 7/2001 | Harari et al. | | EP | 0 829 908 | 3/1998 |
| 6,271,551 B1 | 8/2001 | Schmitz et al. | | EP | 1 020 900 | 7/2000 |
| 6,271,726 B1 | 8/2001 | Fransis et al. | | EP | 1 174 928 | 1/2002 |
| 6,291,321 B1 * | 9/2001 | Fitzgerald | | FR | 2 701 599 | 9/1993 |
| 6,313,016 B1 | 11/2001 | Kibbel et al. | | GB | 2 342 777 | 4/2000 |
| 6,316,301 B1 | 11/2001 | Kant | | JP | 61-141116 | 6/1986 |
| 6,323,108 B1 | 11/2001 | Kub et al. | | JP | 2-210816 | 8/1990 |
| 6,329,063 B2 | 12/2001 | Lo et al. | | JP | 3-036717 | 2/1991 |
| 6,335,546 B1 | 1/2002 | Tsuda et al. | | JP | 4-307974 | 10/1992 |
| 6,339,232 B1 | 1/2002 | Takagi | | JP | 5-166724 | 7/1993 |
| 6,350,993 B1 * | 2/2002 | Chu et al. ..................... 257/19 | | JP | 6-177046 | 6/1994 |
| 6,352,909 B1 | 3/2002 | Usenko | | JP | 7-106446 | 4/1995 |
| 6,368,733 B1 | 4/2002 | Nishinaga | | JP | 7-240372 | 9/1995 |
| 6,372,356 B1 | 4/2002 | Thornton et al. | | JP | 10-270685 | 10/1998 |
| 6,372,593 B1 | 4/2002 | Hattori et al. | | JP | 11-233744 | 8/1999 |
| 6,399,970 B2 | 6/2002 | Kubo et al. | | JP | 6-252046 | 11/1999 |
| 6,403,975 B1 * | 6/2002 | Brunner et al. ............... 257/15 | | JP | 2000-031491 | 1/2000 |
| 6,407,406 B1 | 6/2002 | Tezuka | | | | |

| JP | 2000-021783 | 8/2000 |
| JP | 2001-319935 | 11/2001 |
| JP | 2002-076334 | 3/2002 |
| JP | 2002-164520 | 6/2002 |
| JP | 2002-289533 | 10/2002 |
| WO | 98/59365 | 12/1998 |
| WO | WO 9859365 A1 * | 12/1998 |
| WO | 99/53539 | 10/1999 |
| WO | 00/48239 | 8/2000 |
| WO | 00/54338 | 9/2000 |
| WO | 01/022482 | 3/2001 |
| WO | 01/54202 | 7/2001 |
| WO | 01/93338 | 12/2001 |
| WO | 01/99169 | 12/2001 |
| WO | 02/13262 | 2/2002 |
| WO | 02/15244 | 2/2002 |
| WO | 02/27783 | 4/2002 |
| WO | 02/47168 | 6/2002 |
| WO | 02/071488 | 9/2002 |
| WO | 02/071491 | 9/2002 |
| WO | 02/071495 | 9/2002 |
| WO | 02/082514 | 10/2002 |

OTHER PUBLICATIONS

Armstrong et al., "Design of Si/SiGe Heterojunction Complementary Metal-Oxide-Semiconductor Transistors," IEDM Technical Digest (1995 International Electron Devices Meeting) pp. 761-764.

Armstrong, "Technology for SiGe Heterostructure-Based CMOS Devices", PhD Thesis, Massachusetts Institute of Technology, 1999, pp. 1-154.

Augusto et al., "Proposal for a New Process Flow for the Fabrication of Silicon-based Complementary MOD-MOSFETs without ion Implantation," Thin Solid Films, vol. 294, No. 1-2, pp. 254-258 (Feb. 15, 1997).

Barradas et al., "RBS analysis of MBE-grown SiGe/(001) Si heterostructures with thin, high Ge content SiGe channels for HMOS transistors," Modern Physics Letters B (2001) (abstract).

Borenstein et al., "A New Ultra-Hard Etch-Stop Layer for High Precision Micromachining," Proceedings of the 1999 12th IEEE International Conference on Micro Electro Mechanical Systems (MEMs) (Jan. 17-21, 1999) pp. 205-210.

Bouillon et al., "Search for the optimal channel architecture for 0.18/0.12 µm bulk CMOS Experimental study," IEEE, (1996) pp. 21.2.1-21.2.4.

Bruel et al., "®Smart Cut: A Promising new SOI Material Technology," Proceedings 1995 IEEE International SOI Conference (Oct. 1995) pp. 178-179.

Bruel, "Silicon on Insulator Material Technology," Electronic Letters, vol. 13, No. 14 (Jul. 6, 1995) pp. 1201-1202.

Bufler et al., "Hole transport in strained Si1-xGex alloys on Si1-yGey substrates," Journal of Applied Physics, vol. 84, No. 10 (Nov. 15, 1998) pp. 5597-5602.

Burghartz et al., "Microwave Inductors and Capacitors in Standard Multilevel Interconnect Silicon Technology", IEEE Transactions on Microwave Theory and Techniques, vol. 44, No. 1, Jan. 1996, pp. 100-104.

Canaperi et al., "Preparation of a relaxed Si-Ge layer on an insulator in fabricating high-speed semiconductor devices with strained epitaxial films," International Business Machines Corporation, USA (2002) (abstract).

Carlin et al., "High Efficiency GaAs-on-Si Solar Cells with High Voc Using Graded GeSi Buffers," IEEE (2000) pp. 1006-1011.

Chang et al., "Selective Etching of SiGe/Si Heterostructures," Journal of the Electrochemical Society, No. 1 (Jan. 1991) pp. 202-204.

Cheng et al., "Electron Mobility Enhancement in Strained-Si n-MOSFETs Fabricated on SiGe-on-insulator (SGOI) Substrates," IEEE Electron Device Letters, vol. 22, No. 7 (Jul. 2001) pp. 321-323.

Cheng et al., "Relaxed Silicon-Germanium on Insulator Substrate by Layer Transfer," Journal of Electronic Materials, vol. 30, No. 12 (2001) pp. L37-L39.

Cullis et al, "Growth ripples upon strained SiGe epitaxial layers on Si and misfit dislocation interactions," Journal of Vaccuum Science and Technology A, vol. 12, No. 4, (Jul./Aug. 1994) pp. 1924-1931.

Currie et al., "Carrier mobilities and process stability of strained S in- and p-MOSFET on SiGe virtual substrates," J. Vac. Sci. Technol. B., vol. 19, No. 6 (Nov./Dec. 2001) pp. 2268-2279.

Eaglesham et al., "Dislocation-Free Stranski-Krastanow Growth of Ge on Si(100)," Physical Review Letters, vol. 64, No. 16 (Apr. 16, 1990) pp. 1943-1946.

Feijoo et al., "Epitaxial Si-Ge Etch Stop Layers with Ethylene Diamine Pyrocatechol for Bonded and Etchback Silicon-on-Insulator," Journal of Electronic Materials, vol. 23, No. 6 (Jun. 1994) pp. 493-496.

Fischetti et al., "Band structure, deformation potentials, and carrier mobility in strained Si, Ge, and SiGe alloys," J. Appl. Phys., vol. 80, No. 4 (Aug. 15, 1996) pp. 2234-2252.

Fischetti, "long-range Coulomb interactions in small Si devices. Part II. Effective electronmobility in thin-oxide structures," Journal of Applied Physics, vol. 89, No. 2 (Jan. 15, 2001) pp. 1232-1250.

Fitzgerald et al., "Dislocation dynamics in relaxed graded composition semiconductors," Materials Science and Engineering B67, (1999) pp. 53-61.

Fitzgerald et al., "Relaxed GexSi1-x structures for III-V integration with Si and high mobility two-dimensional electron gases in Si," AT&T Bell Laboratories, Murray Hill, NJ 07974 (1992) American Vacuum Society, pp. 1807-1819.

Fitzgerald et al., "Totally Relaxed GexSi1-x Layers with Low Threading Dislocation Densities Grown on Si Substrates," Applied Physics Letters, vol. 59, No. 7 (Aug. 12, 1991) pp. 811-813.

Garone et al., "Silicon vapor phase epitaxial growth catalysis by the presence of germane," Applied Physics Letters, vol. 56, No. 13 (Mar. 26, 1990) pp. 1275-1277.

Gray and Meyer, "Analysis and Design of Analog Integrated Circuits", John Wiley & Sons, 1984, pp. 605-632.

Gützmacher et al., "Ge segregation in SiGe/Si heterostructures and its dependence on deposition technique and growth atmosphere," Applied Physics Letters, vol. 63, No. 18 (Nov. 1, 1993) pp. 2531-2533.

Hackbarth et al., "Alternatives to thick MBE-grown relaxed SiGe buffers," Thin Solid Films, vol. 369, No. 1-2 (Jul. 2000) pp. 148-151.

Hackbarth et al., "Strain relieved SiGe buffers for Si-based heterostructure field-effect transistors," Journal of Crystal Growth, vol. 201/202 (1999) pp. 734-738.

Herzog et al., "SiGe-based FETs: buffer issues and device results," Thin Solid Films, vol. 380 (2000) pp. 36-41.

Höck et al., "Carrier mobilities in modulation doped Si1-xGes heterostructures with respect to FET applications," Thin Solid Films, vol. 336 (1998) pp. 141-144.

Höck et al., "high hole mobility in SiO.17 Ge0.83 channel metal-oxide-semiconductor field-effect transistors grown by plasma-enhanced chemical vapor deposition," Applied Physics Letters, vol. 76, No. 26 (Jun. 26, 2000) pp. 3920-3922.

Höck et al., "High performance 0.25 µm p-type Ge/SiGe MODFETs," Electronics Letters, vol. 34, No. 19 (Sep. 17, 1998) pp. 1888-1889.

Huang et al., "High-quality strain-relaxed SiGe alloy grown on implanted silicon-on-insulator substrate," Applied Physics Letters, vol. 76, No. 19 (May 8, 2000) pp. 2680-2682.

Huang et al., "The Impact of Scaling Down to Deep Submicron on CMOS RF Circuits", IEEE Journal of Solid-State Circuits, vol. 33, No. 7, Jul. 1998, pp. 1023-1036.

IBM Technical Disclosure Bulletin, vol. 35, No. 4B (Sep. 1992), "2 Bit/Cell EEPROM Cell Using Band to Band Tunneling for Data Read-Out," pp. 136-140.

IBM Technical Disclosure Bulletin, vol. 32, No. 8A, Jan. 1990, "Optimal Growth Technique and Structure for Strain Relaxation of Si-Ge Layers on Si Substrates", pp. 330-331.

Ishikawa et al., "Creation of Si-Ge-based SIMOX structures by low energy oxygen implantation," Proceedings 1997 IEEE International SOI Conference (Oct. 1997) pp. 16-17.

Ishikawa et al., "SiGe-on-insulator substrate using SiGe alloy grown Si(001)," Applied Physics Letters, vol. 75, No. 7 (Aug. 16, 1999) pp. 983-985.

Ismail et al., "Modulation-doped n-type Si/Si-Ge with inverted interface," Appl. Phys. Lett., vol. 65, No. 10 (Sep. 5, 1994) pp. 1248-1250.

Ismail, "Si/SiGe High-Speed Field-Effect Transistors," Electron Devices Meeting, Washington, D.C. (Dec. 10, 1995) pp. 20.1.1-20.1.4.

Kearney et al., "The effect of alloy scattering on the mobility of holes in a Si1-xGex quantum well," Semicond. Sci Technol., vol. 13 (1998) pp. 174-180.

Kim et al., "A Fully Integrated 1.9-GHz CMOS Low-Noise Amplifier", IEEE Microwave and Guided Wave Letters, vol. 8, No. 8, Aug. 1998, pp. 293-295.

Koester et al., "Extremely High Transconductance Ge/Si0.4Ge0.6 p-MODFET's Grown by UHV-CVD," IEEE Electron Device Letters, vol. 21, No. 3 (Mar. 2000) pp. 110-112.

König et al., "Design Rules for n-Type SiGe Hetero FETs," Solid State Electronics, vol. 41, No. 10 (1997), pp. 1541-1547.

König et al., "p-Type Ge-Channel MODFET's with High Transductance Grown on Si Substrates," IEEE Electron Device Letters, vol. 14, No. 4 (Apr. 1993) pp. 205-207.

König et al., "SiGe HBTs and HFETs," Solid-State Electronics, vol. 38, No. 9 (1995) pp. 1595-1602.

Kuznetsov et al., "Technology for high-performance n-channel SiGe modulation-doped field-effect transistors," J. Vac. Sci. Technol., B 13(6), pp. 2892-2896 (Nov./Dec. 1995).

Larson, "Integrated Circuit Technology Options for RFIC's□Present Status and Future Directions", IEEE Journal of Solid-State Circuits, vol. 33, No. 3, Mar. 1998, pp. 387-399.

Lee and Wong, "CMOS RF Integrated Circuits at 5 GHz and Beyond", Proceedings of the IEEE, vol. 88, No. 10, Oct. 2000, pp. 1560-1571.

Lee et al., "Strained Ge channel p-type metal-oxide-semiconductor field-effect transistors grown on Si1-xGex/Si virtual substrates," Applied Physics Letters, vol. 79, No. 20 (Nov. 12, 2001) pp. 3344-3346.

Lee et al., "Strained Ge channel p-type MOSFETs fabricated on Si1-xGex/Si virtual substrates," Mat. Res. Soc. Symp. Proc., vol. 686 (2002) pp. A1.9.1-A1.9.5.

Leitz et al., "Channel Engineering of SiGe-Based Heterostructures for High Mobility MOSFETs," Mat. Res. Soc. Symp. Proc., vol. 686 (2002) pp. A3.10.1-A3.10.6.

Leitz et al., "Dislocation glide and blocking kinetics in compositionally graded SiGe/Si," Journal of Applied Physics, vol. 90, No. 6 (Sep. 15, 2001) pp. 2730-2736.

Leitz et al., "Hole mobility enhancements in strained Si/Si1-yGey p-type metal-oxide-semiconductor field-effect transistors grown on relaxed Si1-xGex (x<y) virtual substrates," Applied Physics Letters, vol. 79, No. 35 (Dec. 17, 2001) pp. 4246-4248.

Li et al., "Design of high speed Si/SiGe heterojunction complementary metal-oxide-semiconductor field effect transistors with reduced short-channel effects," J. Vac. Sci. Technol., A vol. 20 No. 3 (May/Jun. 2002) pp. 1030-1033.

Lu et al., "High Performance 0.1 □m Gate-Length P-Type SiGe MODFET's and MOS-MODFET's", IEEE Transactions on Electron Devices, vol. 47, No. 8, Aug. 2000, pp. 1645-1652.

M. Kummer et al., "Low energy plasma enhanced chemical vapor deposition," Materials Science and Engineering B89 (2002) pp. 288-295.

Maiti et al., "Strained-Si heterostructure field effect transistors," Semicond. Sci. Technol., vol. 13 (1998) pp. 1225-1246.

Maszra, "Silicon-On-Insulator by Wafer Bonding: A Review," Journal of the Electrochemical Society, No. 1 (Jan. 1991) pp. 341-347.

Meyerson et al., "Cooperative Growth Phenomena in Silicon/Germanium Low-Temperature Epitaxy," Applied Physics Letters, vol. 53, No. 25 (Dec. 19, 1988) pp. 2555-2557.

Mizuno et al., Advanced SOI-MOSFETs with Strained-SI Channel for High Speed CMOS-Electron/Hole Mobility Enhancement, 2002 SYmposium on VLSI Technology, Digest of Technical Papers, Honolulu, (Jun. 13-15), IEEE New York, NY, pp. 210-211.

Mizuno et al., "Electron and Hold Mobility Enhancement in Strained-Si MOSFET's on SiGe-on-Insulator Substrates Fabricated by SIMOX Technology," IEEE Electron Device Letters, vol. 21, No. 5 (May 2000) pp. 230-232.

Mizuno et al., "High Performance Strained-Si p-MOSFETs on SiGe-on-Insulator Substrates Fabricated by SIMOX Technology," IEEE IDEM Technical Digest, (1999 International Electron Device Meeting) pp. 934-936.

Nayak et al., "High-Mobility Strained-Si PMOSFET's"; IEEE Transactions on Electron Devices, vol. 43, No. 10, Oct. 1996, pp. 1709-1716.

O'Neill et al., "SiGe Virtual substrate N-channel heterojunction MOSFETS," Semicond. Sci. Technol., vol. 14 (1999) pp. 784-789.

Papananos, "Radio-Frequency Microelectronic Circuits for Telecommunications Applications", Kluwer Academic Publishers, 1999, pp. 115-117, 188-193.

O'ta, Y. et al., "Application of heterojunction FET to power amplifier for cellular telephone," Electronic Letters, IEE Stevanage, GB, vol. 30 No. 11, May 26, 1994, pp. 906-907.

Parker et al., "SiGe heterostructure CMOS circuits and applications," Solid State Electronics, vol. 43 (1999) pp. 1497-1506.

Ransom et al., "Gate-Self-Aligned n-channel and p-channel Germanium MOSFET's," IEEE Transactions on Electron Devices, vol. 38, No. 12 (Dec. 1991) pp. 2695.

Reinking et al., "Fabrication of high-mobility Ge p-channel MOSFETs on Si substrates," Electronics Letters, vol. 35, No. 6 (Mar. 18, 1999) pp. 503-504.

Rim et al., "Enhanced Hole Mobilities in Surface-channel Strained-Si p-MOSFETs"; IEDM, 1995, pp. 517-520.

Rim et al., "Fabricatio and Analysis of Deep Submicron Strained-Si N-MOSFET's "; IEEE Transactions on Electron Devices, vol. 47, No. 7, Jul. 2000, pp. 1406-1415.

Rim, "Application of Silicon-Based Heterostructres to Enhanced Mobility Metal-Oxide-Semiconductor Field-Effect Transistors", PhD Thesis, Stanford University, 1999; pp. 1-184.

Robbins et al., "A model for heterogeneous growth of Si1-xGex films for hydrides," Journal of Applied Physics, vol. 58, No. 6 (Mar. 15, 1991) pp. 3729-3732.

Sadek et al., "Design of Si/SiGe Heterojunction Complementary Metal-Oxide-Semiconductor Transistors," IEEE Trans. Electron Devices (Aug. 1996) pp. 1224-1232.

Schäffler, "High-Mobility Si and Ge Structures," Semiconductor Science and Technology, vol. 12 (1997) pp. 1515-1549.

Sugimoto and Ueno, "A 2V, 500 MHz and 3V, 920 MHz Low-Power Current-Mode 0.6 □m CMOS VCO Circuit", IEICE Trans. Electron., vol. E82-C, No. 7, Jul. 1999, pp. 1327-1329.

Tement et al., "Metal Gate Strained Silicon MOSFETs for Microwave Integrated Circuits", IEEE Oct. 2000, pp. 38-43.

Tweet et al., "Factors determining the composition of strained GeSi layers grown with disilane and germane," Applied Physics Letters, vol. 65, No. 20 (Nov. 14, 1994) pp. 2579-2581.

Usami et al., "Spectroscopic study of Si-based quantum wells with neighboring confinement structure," Semicon. Sci. Technol. (1997) (abstract).

Welser et al., "Electron Mobility Enhancement in Strained-Si N-Type Metal-Oxide-Semiconductor Field-Effect Transistors," IEEE Electron Device Letters, vol. 15, No. 3 (Mar. 1994) pp. 100-102.

Welser, "The Application of Strained Silicon/Relaxed Silicon Germanium Heterostructures to Metal-Oxide-Semiconductor Field-Effect Transistors," PhD Thesis, Stanford University, 1994, pp. 1-205.

Welser et al., "NMOS and PMOS Transistors Fabricated in Strained Silicon/Relaxed Silicon-Germanium Structures," IEEE IDEM Technical Digest (1992 International Electron Devices Meeting) pp. 1000-1002.

Welser et al., "Evidence of Real-Space Hot-Electron Transfer in High Mobility, Strained-Si Multilayer MOSFETs," IEEE IDEM Technical Digest (1993 International Electron Devices Meeting) pp. 545-548.

Wolf and Tauber, Silicon Processing for the VLSI Era, vol. 1: Process Technology, Lattice Press, Sunset Beach, CA, pp. 384-386 (1986).

Xie et al., "Semiconducto Surface Roughness: Dependence on Sign and Magnitude of Bulk Strain," The Physical Review Letters, vol. 73, No. 22 (Nov. 28, 1994) pp. 3006-3009.

Xie et al., "Very high mobility two-dimensional hole gas in Si/GexSi1-x/Ge structures grown by molecular beam epitaxy," Appl. Phys. Lett., vol. 63, No. 16 (Oct. 18, 1993) pp. 2263-2264.

Xie, "SiGe Field effect transistors," Materials Science and Engineering, vol. 25 (1999) pp. 89-121.

Yeo et al., "Nanoscale Ultra-Thin-Body Silicon-on-Insulator P-MOSFET with a SiGe/Si Heterostructure Channel," IEEE Electron Device Letters, vol. 21, No. 4 (Apr. 2000) pp. 161-163.

Zhang et al., "Demonstration of a GaAs-Based Compliant Substrate Using Wafer Bonding and Substrate Removal Techniques," Electronic Materials and Processing Research Laboratory, Department of Electrical Engineering, University Park, PA 16802 (1998) pp. 25-28.

Tsang et al., "Measurements of alloy composition and strain in thin $Ge_xSi_{1-x}$ layers," *J. Appl. Phys.*, vol. 75 No. 12 (Jun. 15, 1994) pp. 8098-8108.

Sakaguchi et al., "ELTRAN® by Splitting Porous Si Layers," Proc. 195$^{th}$ Int. SOI Symposium, vol. 99-3, *Electrochemical Society* (1999) pp. 117-121.

Yamagata et al., "Bonding, Splitting and Thinning by Porous Si in ELTRAN®; SOI-Epi Wafer™," *Mat. Res. Soc. Symp. Proc.*, vol. 681E (2001) pp. I8.2.1-I8.2.10.

Godbey et al., (1990) "Fabrication of Bond and Etch-Back Silicon Insulator Using a Strained $SI_{0.7}GE_{0.3}$ Layer as an Etch Stop," *Journal of the Electrical Society*, vol. 137, No. 10, (Oct. 1990) pp. 3219-3223.

Grillot et al., "Acceptor diffusion and segregation in $(Al_xGa_{1-x})_{0.5}In_{0.5}P$ heterostructures," *Journal of Applied Physics*, vol. 91, No. 8 (2002), pp. 4891-4899.

Halsall et al., "Electron diffraction and Raman studies of the effect of substrate misorientation on ordering in the AlGaInP system," *Journal of Applied Physics*, vol. 85, No. 1 (1999), pp. 199-202.

Hsu et al., "Surface morphology of related $Ge_xSi_{1-x}$ films," *Appl. Phys. Lett.*, vol. 61, No. 11 (1992), PP. 1293-1295.

Huang et al., (2001) "Carrier Mobility enhancement in strained Si-on-insulatoir fabricated by wafer bonding", *2001 Symposium on VLSI Technology, Digest of Technical Papers*, pp. 57-58.

Langdo et al., (2002) "Preparation of Novel SiGe-free Strained Si on Insulator Substrates" *IEEE International SOI Conference*, pp. 211-212 (XP002263057).

Currie et al., Controlling Threading Dislocation in Ge on Si Using Graded SiGe Layers and Chemical-Mechanical Polishing,: vol. 72, No. 14, p. 1718-1720. Feb. 1998.

* cited by examiner

*Primary Examiner*—Laura M. Schillinger
(74) *Attorney, Agent, or Firm*—Goodwin Procter LLP

(57) ABSTRACT

A semiconductor structure including a semiconductor substrate, at least one first crystalline epitaxial layer on the substrate, the first layer having a surface which is planarized, and at least one second crystalline epitaxial layer on the at least one first layer. In another embodiment of the invention there is provided a semiconductor structure including a silicon substrate, and a GeSi graded region grown on the silicon substrate, compressive strain being incorporated in the graded region to offset the tensile strain that is incorporated during thermal processing. In yet another embodiment of the invention there is provided a semiconductor structure including a semiconductor substrate, a first layer having a graded region grown on the substrate, compressive strain being incorporated in the graded region to offset the tensile strain that is incorporated during thermal processing, the first layer having a surface which is planarized, and a second layer provided on the first layer. In still another embodiment of the invention there is provided a method of fabricating a semiconductor structure including providing a semiconductor substrate, providing at least one first crystalline epitaxial layer on the substrate, and planarizing the surface of the first layer.

5 Claims, 5 Drawing Sheets

| | SAMPLE A | SAMPLE B | SAMPLE C | SAMPLE D |
|---|---|---|---|---|
| FINAL Ge COMPOSITION | 100% | 100% | 50% | 100% |
| GRADING RATE (% Ge $\mu m^{-1}$) | 5 | 10 | 10 | 10 |
| TOTAL EPITAXIAL THICKNESS ($\mu m$) | 23 | 12 | 6.5 | 12 |
| GROWTH TEMPERATURE (°C) | 750 | 800 | 750 | 50-76%:750 76-100%:550 |
| GROWTH PRESSURE (mT) | 25 | 50 | 25 | 50-76%:25 76-100%:3 |
| CMP AT 50% | NO | NO | — | YES |
| THREADING DISLOCATION DENSITY ($cm^{-2}$) | $1\pm0.1\times10^7$ | $1-5\times10^7$ | $6.3\pm0.1\times10^6$ | $2.1\pm0.2\times10^6$ |
| CRACK DENSITY ($cm^{-1}$) | $47\pm5$ | 0 | 0 | 0 |
| PARTICLE DENSITY ($cm^{-2}$) | $1250\pm100$ | $600\pm40$ | $50\pm5$ | $150\pm10$ |
| RMS ROUGHNESS (nm) | 35.9 | 47 | 37.3 | 24.2 |
| $a_\perp$ OF TOP LAYER (Å) | 5.6559 | 5.6558 | 5.5327 | 5.6597 |
| $a_\parallel$ OF TOP LAYER (Å) | 5.6559 | 5.6552 | 5.5352 | 5.6409 |

GROWTH PARAMETERS AND CHARACTERIZATION RESULTS OF SAMPLES A-D

FIG. 2

CONTROLLING THREADING DISLOCATION DENSITIES IN GE ON SI USING GRADED GESI LAYERS AND PLANARIZATION

PRIORITY INFORMATION

This application is a continuation of Ser. No. 09/712,604 filed on Nov. 14, 2000 abandoned which is a continuation of Ser. No. 09/265,016 filed Mar. 9, 1999, now U.S. Pat. No. 6,291,321 which is a divisional of Ser. No. 09/103,672 filed Jun. 23, 1998, now U.S. Pat. No. 6,107,653 which claims priority from provisional applications Ser. No. 60/050,602 filed Jun. 24, 1997 and 60/059,765 filed Sep. 16, 1997.

BACKGROUND OF THE INVENTION

The invention relates to a method of creating flat, crack-free low-dislocation-density mismatched semiconductor layers, and of controlling threading dislocation densities in Ge on Si using graded SiGe layers.

The progression of electronic and optoelectronic components and systems is creating a need for more complex system-level functions to be incorporated at the chip level. One of the effects of this demand is to bring ever-increasing pressure to use materials that are not lattice-matched to common substrates.

The technological significance of a totally miscible GeSi system has been well documented. In particular, relaxed graded GeSi buffers have been used as "substrates" for the growth of high electron mobility structures and for the integration of III-V devices on Si. The relaxed graded buffer introduces a 4% lattice mismatch between Si and Ge gradually, resulting in a disperse, three-dimensional misfit dislocation network. Strain-relieving glide of threading dislocations is facilitated, preventing the accumulation of mismatch strain. Because threading dislocations present in the initial layers can also be used to relieve strain in subsequent layers, the nucleation of additional dislocations is suppressed as the graded layer growth progresses. However, a complication arises during thick grades to high Ge concentrations.

The characteristic crosshatch surface roughness and the underlying strain fields of the misfit array can overlap, blocking threading dislocation glide and leading to dislocation pile-ups. The formation of these pile-ups necessitates the nucleation of additional threading dislocations, as the trapped threading dislocations can no longer contribute to strain relief. Growth on off-cut Si substrates has been shown to improve surface morphology and decrease the number of pileups, but not eliminate them entirely. Therefore, an increase in threading dislocation density and the number of pile-ups is always observed as the thickness of graded layers increases.

SUMMARY OF THE INVENTION

It is therefore an object of the invention to provide a process that allows controlled relaxation of mismatched semiconductor layers so that many different semiconductor materials can be created on common substrates.

It is another object of the invention to provide a method utilizing planarization such as with chemical-mechanical polishing (CMP) which allows for the growth of relaxed graded buffers to 100% Ge without the concomitant increase in threading dislocation density.

It is yet another object of the invention to provide modifications to ultra-high vacuum chemical vapor deposition (UHVCVD) growth procedures which eliminate surface cracks due to the thermal mismatch between Si and Ge and particulate defects due to gas phase nucleation events.

Accordingly, one embodiment of the invention provides a semiconductor structure comprising a semiconductor substrate, at least one first crystalline epitaxial layer on the substrate, the first layer having a surface which is planarized, and at least one second crystalline epitaxial layer on the at least one first layer.

In another embodiment of the invention there is provided a semiconductor structure comprising a silicon substrate, and a GeSi graded region grown on the silicon substrate, compressive strain being incorporated in the graded region to offset the tensile strain that is incorporated during thermal processing.

In yet another embodiment of the invention there is provided a semiconductor structure comprising a semiconductor substrate, a first layer having a graded region grown on the substrate, compressive strain being incorporated in the graded region to offset the tensile strain that is incorporated during thermal processing, the first layer having a surface which is planarized, and a second layer provided on the first layer.

In still another embodiment of the invention there is provided a method of fabricating a semiconductor structure comprising providing a semiconductor substrate, providing at least one first crystalline epitaxial layer on the substrate, and planarizing the surface of the first layer.

BRIEF DESCRIPTION OF THE DRAWINGS

FIG. 2 is a table of growth parameters and characterization results of exemplary structure samples in accordance with the invention;

DETAILED DESCRIPTION OF THE INVENTION

Figure 1:
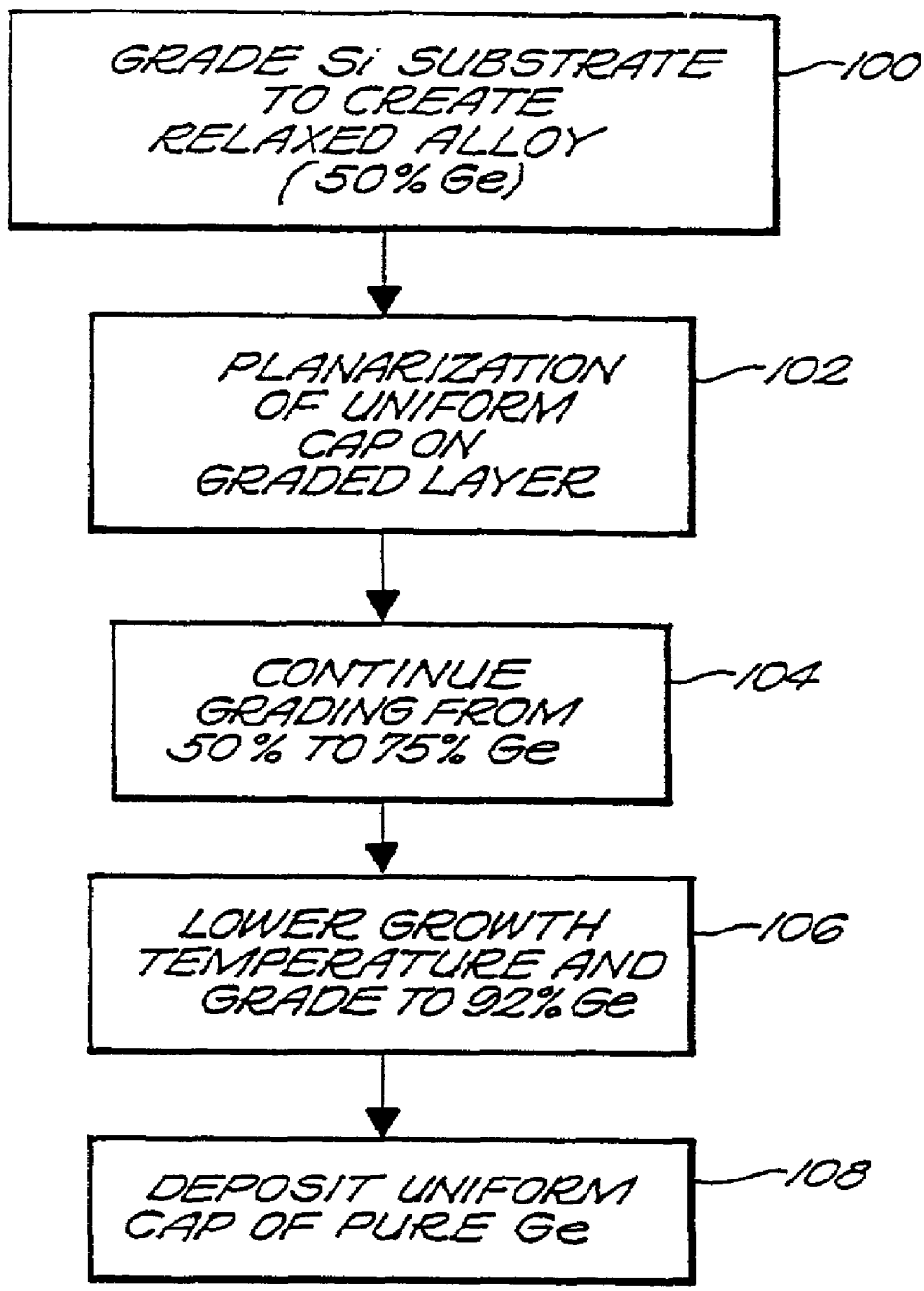
FIG. 1 is a flowchart of processing steps of an exemplary experiment in accordance with the invention.

It has been previously shown that although composition-graded GeSi layers are a viable means to relax GeSi alloys on Si for concentrations <50%, there is a rise in threading dislocation density with continued grading. See, for example, U.S. patent application Ser. No. 08/806,741 filed by Fitzgerald et al., incorporated herein by reference. Thus, despite the fact that, for example, a final Ge layer has a lower defect density than Ge grown directly on Si, the residual defect density is still too high for many applications (~$10^7$ $cm^{-2}$), and the density is certainly greater than relaxed $Ge_{30}Si_{70}$ on Si using this method (~$7 \times 10^5$ $cm^{-2}$). The grading rate for such defect densities in $Ge_{30}Si_{70}$ is 10% Ge per micron of thickness.

In order to reach the desired goal of lower threading dislocation density, the grading rate is decreased to 5% Ge per micron of thickness. From experience, a lower grading rate will lower the threading dislocation density. However, it was found that the threading dislocation density was nearly equivalent to the 10% Ge/micron grading rate, cracks developed due to the thermal mismatch strain, and many particles were found due to what is believed to be gas-phase nucleation of GeSi since germane cracks at much lower temperatures than silane.

The major problems that need to be controlled in the semiconductor structure are the cracking and the threading dislocation density. Cracking is due to the fact that at 5% Ge per micron, the final thickness is very great, and upon cooling from the growth temperature, the thermal mismatch between the deposited layers and Si results in a tensile strain. When the tensile strain is great enough, cracking is the relaxation mechanism, especially if dislocation flow ceases at some temperature during cooling. However, lowering the threading dislocation density requires a greater thickness, since the slower grading rate reduces the threading dislocation density. Thus, it would appear that the removal of cracks and the presence of a low number of threading dislocations are incompatible goals.

A solution is found in the development of these relaxed structures. The need for very gradual grading as one tries to produce relaxed Ge structures with high Ge concentration has its origins in work-hardening in the graded buffer layer; i.e., during continued relaxation, dislocations are blocked by some mechanism in the highly dislocated graded layer, creating the need for the nucleation of more dislocations, and thereby increasing the threading dislocation density. For 10% Ge per micron grading rates, dislocation strain fields themselves can not possibly explain the blocking phenomenon. It has been concluded that the effect of dislocation strain fields on surface morphology aided the blocking of the dislocation motion. In fact, growth on an off-cut wafer shows that such a blocking phenomenon can be decreased, and this experimental evidence supports the hypothesis that the surface roughness is the main issue.

The invention, therefore, applies a planarization step within the growth of the buffer layer to remove the roughness created by the dislocations introduced during relaxation; i.e., the process effectively removes the "history" of the surface by planarization, preventing the continued roughening and grooving of the surface that leads to dislocation blocking. A drastic effect is found: the rise in threading dislocation density as one continues to grade can be completely eliminated.

FIG. 1 is a flowchart of processing steps of an exemplary experiment in accordance with the invention. A summary of the exemplary experiment is as follows:

Initially (step 100), a Si substrate is graded at 10% Ge per micron to $Ge_{50}Si_{50}$ to create a relaxed alloy for exploring the growth at the high-Ge end which was problematic. This grading rate was not lowered since there was only a need to explore the high-Ge end. These layers were grown at 750C. ° using UHVCVD. Defect analysis shows that a threading dislocation density on the order of $6 \times 10^6$ cm$^{-2}$ is achieved, exactly what was expected. Also, a number of dislocation pile-ups are found, which indicate that dislocation blocking has begun, but is not totally out of control.

These $Ge_{50}Si_{50}$ wafers had a 2 micron uniform cap on top of the graded layer so that planarization in the form of chemo-mechanical polishing (CMP) can be performed (step 102). It will be appreciated by those of skill in the art that other methods of planarization will also work, such as ion-beam etching or other planarization etching techniques. The CMP process used is the standard CMP in the Si industry, used for polishing Si wafers as well as planarizing back-end Si processes.

After planarization, the wafers are inserted back into the UHVCVD system and grading is continued (i.e. regrowth) (step 104). Deposition is started at the $Ge_{50}Si_{50}$ composition, and graded at 10% Ge per micron to 75% Ge, all at a growth temperature of 750C. °.

The growth temperature is then lowered to 550C. °. Then grading to 92% Ge occurs, at 10% Ge per micron (step 106).

A uniform cap of pure Ge is deposited, with 1-1.5 micron in thickness (step 108). This particular experiment has doping in the Ge cap so that Ge photodetectors can be fabricated.

The following description presents exemplary experimental samples which, for purposes of illustration, have been labeled as samples A, B, C and D. The control sample in this experiment, sample A, was graded from Si to 100% Ge at a rate of 5% Ge $\mu m^{-1}$. It was grown at 750° C. and 25 mT and topped with a 3 $\mu m$ Ge cap. A linear grade was approximated by increasing the Ge concentration in 2.5%, 5000 Å steps. Sample B was graded to 100% Ge at a rate of 10% Ge $\mu m^{-1}$, at a temperature of 800° C., and at a pressure of 50 mT. This structure corresponds to the sample structure from previous reports on the formation of dislocation pile-ups. Sample C was grown to only 50% Ge at a grading rate of 10% Ge $\mu m^{-1}$ and topped with a 1.5 $\mu m$ 50% Ge cap. The graded region of sample C was composed of 2% Ge, 2000Å jumps.

Nine wafers were produced in this fashion to produce 50% Ge "virtual substrates" on Si for studying the threading dislocation density increase that occurs when grading to high Ge concentrations. Although not optimized for minimum threading dislocation densities, these "substrates" are known to typically possess threading dislocation densities of approxiamtely $5 \times 10^6$ cm$^{-2}$. As the table of FIG. 2 shows, the nine wafers were fine virtual substrates for this study with dislocation densities on this order.

Figure 3:
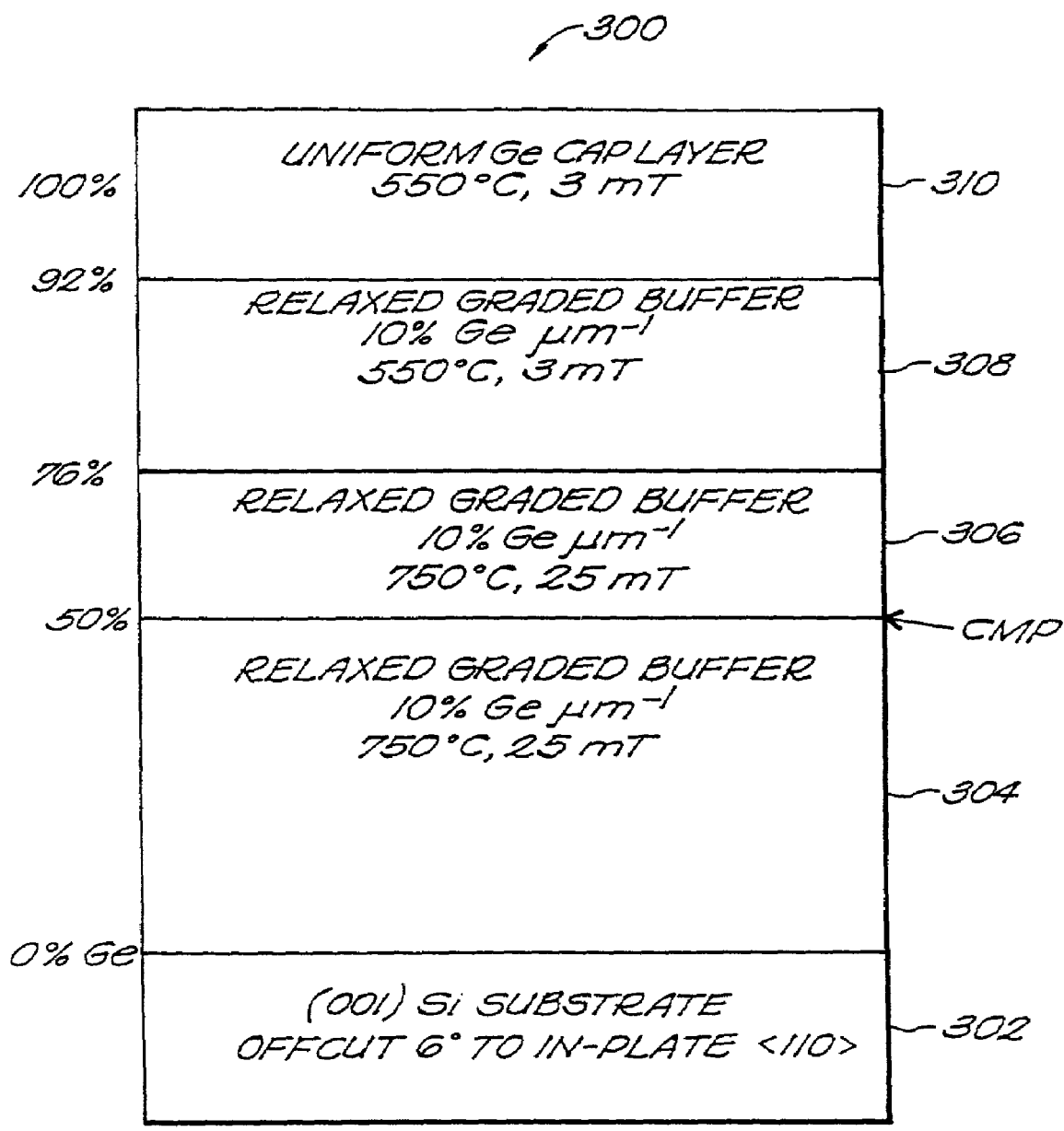
FIG. 3 is a schematic representation of structure and growth conditions for a semiconductor structure in accordance with the invention.

FIG. 3 is a schematic representation of structure and growth conditions for a semiconductor structure 300 (sample D) in accordance with the invention. The structure 300 includes a (001) Si substrate 302 offcut 6° to in-plane <110>. The structure 300 was grown to include a relaxed graded buffer layer or region 304 of only 50% Ge at a grading rate of 10% Ge$\mu m^{-1}$ and topped with a 1.5 $\mu m$ 50% Ge cap. The graded region was composed of 2% Ge, 2000 Å jumps. To this point, the structure corresponds to sample C described heretofore. The top 5000 Å of region 304 was then removed via CMP, and a 50-100% Ge graded buffer region 306 was grown on top at a rate of 10% Ge $\mu m^{-1}$, again in 2%, 2000 Å steps. It will be appreciated by those of skill in the art that the initiation of a second graded layer is accomplished by first growing a lattice-matched homoepitaxial uniform composition buffer layer before grading is initiated. In this 50-76% Ge portion, the growth conditions were held constant at 750° C. and 25 mT. Thereafter, the growth was halted and the temperature and pressure were lowered to 550° C. and 3 mT. The growth of a graded buffer region 308 then continued until a Ge concentration of 92% was reached. The final jump in Ge concentration was made from 92% to 100% and a 1.51 $\mu m$ uniform cap layer 310 was deposited.

Figure 4:
FIG. 4 is a cross-sectional XTEM image of the upper graded region and uniform Ge cap of the structure of the invention.

FIG. 4 is a cross-sectional transmission electron microscope (XTEM) micrograph of the upper graded region and the uniform cap of structure 300 (sample D). All of the samples in the study were grown on (100) Si wafers offcut 6° to the in-plane <110> by UHVCVD.

The four samples were characterized via cross-sectional XTEM, plan view optical microscopy, etch-pit density (EPD), atomic force microscopy (AFM), and triple-axis X-ray diffraction. The relevant results are presented in the table of FIG. 2.

When comparing the threading dislocation densities of the four samples A, B, C and D, both expected and unexpected results are found. Since sample A was grown at a slow grading rate, one would expect it to have a low threading dislocation density if one does not consider the deleterious effects of surface roughening and pile-up formation. Of course, as shown in the previous work, these factors create a high density of threading dislocations, ~$10^7$ cm$^{-2}$. As expected, sample B, a similar sample graded at a faster rate of 10% Ge µm$^{-1}$ to 100% Ge, has an even larger threading dislocation density. The sample C data also confirms the threading dislocation density increase with Ge concentration—at 50% Ge, the threading dislocation density is already in the $10^6$ cm$^{-2}$ range.

However, the structure 300 (sample D), in effect a grade to 100% at 10% Ge µm$^{-1}$, has a similar or even slightly lower threading dislocation density than the sample C—a lower value than that of both sample A and sample B. The addition of the CMP step at 50% Ge has arrested the increase in threading dislocation density with Ge concentration. Hence, the planarization of the surface during this step must free the threads seen in pile-ups in sample C, and allow the dislocations to relieve the strain introduced in the subsequent growth, eliminating the driving force for the nucleation of additional threading dislocations.

Figure 5A:
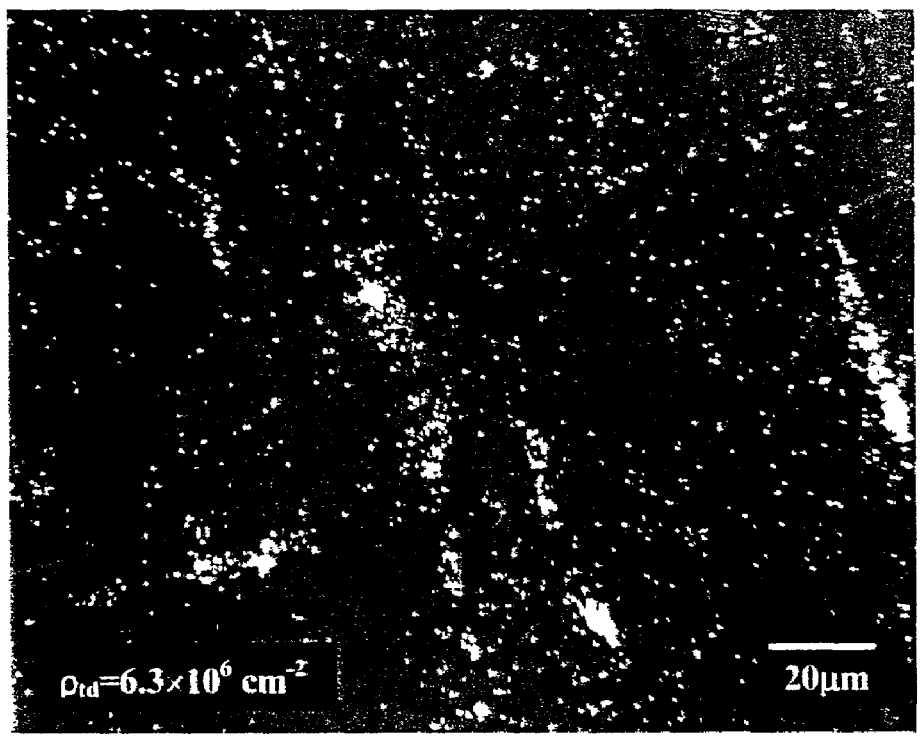
FIGS. 5A and 5B are Nomarski optical micrographs comparing the EPD of exemplary semiconductor structure samples, respectively.
Figure 5B:
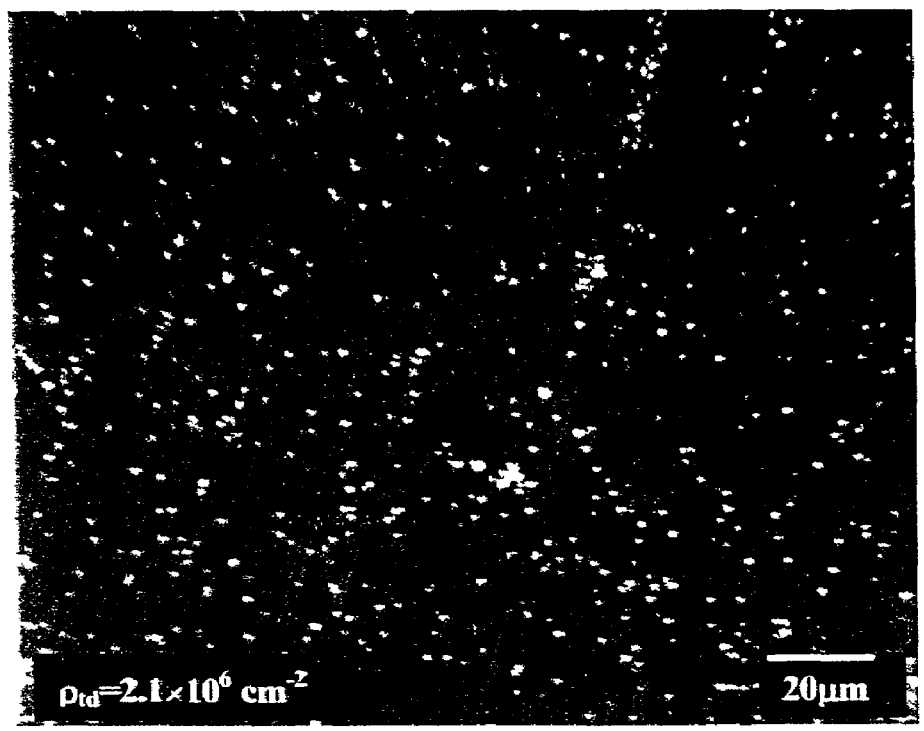

Nomarski optical micrographs comparing the EPD of samples C and D are shown in FIGS. 5A and 5B, respectively. The EPD results indicate threading dislocation densities in sample C, the 10% Ge µm$^{-1}$ grade to 50% Ge, and sample D, the 10% Ge µm$^{-1}$ grade to 100% Ge grown on sample B after a CMP planarization step. The threading dislocation densities are $6.3 \pm 0.1 \times 10^6$ cm$^{-2}$ for sample C, and $2.1 \pm 0.2 \times 10^6$ cm$^{-2}$ for sample D.

It will be appreciated that the pile-ups seen in sample C have been eliminated by the CMP/regrowth step and no substantial pile-ups are seen in sample D. A remarkable observation is that the overall defect morphology is actually improved with further relaxation. It is postulated that when the initial portion of growth is optimized to further decrease its baseline threading dislocation density, the growth of relaxed graded GeSi buffers to 100% Ge with much lower final defect densities will be achieved.

By examining the AFM data from the four samples, the influence of surface roughness on threading dislocation density is recognized. Sample B, the 10% Ge µm$^{-1}$ grade to 100% Ge, has the highest rms roughness, 47 nm. The high surface roughness is due to the fast grading rate, creating the highest threading dislocation density of the four samples—well over $10^7$ cm$^{-2}$. When the grading rate is decreased to 5% Ge µm$^{-1}$ for sample A, a corresponding decrease in surface roughness to 35.9 nm is observed. This roughness is on par with that of sample C and large enough to create pile-ups and increased threading dislocation density in both samples. With the inclusion of the CMP step in sample D, the resulting final surface roughness, 24.2 nm, is much lower than that of sample B despite the same grading rate, and lower than that of the more slowly graded sample A. This result is a parallel observation to the threading dislocation density data discussed previously, and it emphasizes the importance of the inclusion of a CMP step in thick graded buffer growth.

When a thick graded SiGe buffer like sample A is grown at high temperatures, cracks in the surface can result during cooling due to the thermal mismatch between Si and Ge. Between the sample A growth temperature of 750° C. and room temperature, the thermal expansion coefficient of Si, $\alpha_{Si}$, varies from $4.27 \times 10^{-6}$ K$^{-1}$ to $2.57 \times 10^{-6}$ K$^{-1}$ and $\alpha_{Ge}$ varies from $8.55 \times 10^{-6}$ K$^{-1}$ to $5.90 \times 10^{-6}$ K$^{-1}$. Because the coefficient of thermal expansion of Ge is greater than that of Si, severe tensile stresses can result in the upper Ge-rich portion of the buffer.

In sample A, the calculated strain due to thermal mismatch when cooling to room temperature is $2.6 \times 10^{-3}$, resulting in a high density of surface cracks. When growing sample D, growth modifications specifically designed to alleviate this cracking problem are added. By grading at twice the rate, the total amount of deposited material and the strain energy from the thermal stress accordingly is decreased. More importantly, the fast grading rate at lower temperature and the final Ge concentration jump in sample D, from 92% to 100%, incorporate metastable compressive residual stress into the buffer at the growth temperature. Since the compressive lattice mismatch opposes the tensile thermal mismatch, sample D is left in a nearly stress-free state at room temperature.

The X-ray diffraction data indicates that the top layer is actually slightly compressive, preventing any surface cracking. Additionally, due to the large final jump in Ge concentration, the graded buffer of sample D has nearly 1 µm less Ge-rich material than sample B, decreasing its absolute value of strain energy from thermal mismatch stress. Hence, even though neither sample D nor sample B experienced surface cracking after growth, sample D will be the superior substrate for subsequent integration of III-V materials which are also thermally mismatched to Si. The lower growth temperature during the high Ge portion of sample D also decreased the amount of particulate contamination from gas phase nucleation events. These events occur much more frequently as the growth temperature and pressure increase, particularly near the melting point of the solid alloy.

By including a planarization step in the graded buffer growth process, and by making several growth modifications, a 100% Ge graded buffer has been grown at 10% Ge µm$^{-1}$ that exhibits a final threading dislocation density an order of magnitude lower than that of sample A, the 5% Ge µm$^{-1}$ grade with no planarization step. Additionally, the nucleation of threading dislocations in the 50-100% Ge portion of the growth has been suppressed through the release of immobile dislocations located in dislocation pile-ups. The surface morphology of the graded buffer has also been improved. Finally, surface cracking due to the thermal mismatch between Si and Ge and particles due to gas phase nucleation events have both been eliminated. These growth modifications not only allow for obtaining higher quality Ge on Si, but also suggest a strategy for the growth of Ge on Si with lower defect densities on the order of bulk Ge substrates.

In general, the previous knowledge of the low-Ge-concentration alloys is now combined with the newly observed properties of films grown to higher Ge concentrations as discussed above. Since threading dislocation densities for Ge$_{30}$Si$_{70}$ graded at 10% per micron are in the low $10^5$ cm$^{-2}$ range, a combination of optimal conditions for the low and high Ge concentration can lead to very low threading dislocation density, pure Ge-coated Si wafers with $10^5$ cm$^{-2}$ threading dislocation density. GaAs can subsequently deposited on Ge, creating III-V material monolithically integrated to Si.

The invention thus provides a method of producing low threading dislocation density by using planarization steps within the graded buffer. The invention essentially involves growing one lattice-mismatched semiconductor on another, planarizing the semiconductor growth, and regrowing a semiconductor on the polished surface, and continuing to grow a lattice-mismatched structure that continues to relax. In addition, the growth temperatures are reduced at the high Ge end to balance the thermal expansion difference between Ge and Si by trapping a residual amount of opposite-sign lattice mismatch.

An optimum structure is configured as described above. An alternative exemplary embodiment of a semiconductor structure is configured as follows. Initially, the structure is graded to $Ge_{35}Si_{65}$ at 5%/micron at 750° C. The surface is then planarized by, for example, CMP. Next, one would regrow and grade to $Ge_{75}Si_{25}$ at 650° C. Thereafter, the surface is again planarized by CMP. Finally, the structure is regrown and graded to uniform Ge at 550° C.

Although the foregoing description reports these particular sequences, it is noted that small variations to this sequence may produce the same results, and the optimum number of planarization steps may vary. It is clear that at least one planarization step in the structure is needed, and very likely two planarization steps is needed for Ge on Si to ensure high quality material.

Although the present invention has been shown and described with respect to several preferred embodiments thereof, various changes, omissions and additions to the form and detail thereof, may be made therein, without departing from the spirit and scope of the invention.

What is claimed is:

1. A method of fabricating a semiconductor structure, the method comprising the steps of:
   a. providing a semiconductor substrate;
   b. providing on said substrate a graded semiconductor region incorporating a first type of strain; and
   c. thermally processing the graded region so as to introduce a second type of strain, the previously incorporated first type of strain reducing the process-induced second type of strain.

2. The method of claim 1, further comprising the step of planarizing at least one surface of the structure.

3. The method of claim 1, wherein the first type of strain is compressive strain and the second type of strain is tensile strain.

4. The method of claim 3, wherein the graded region comprises Si and Ge graded to an increasing concentration of Ge, and the step of incorporating compressive strain comprises decreasing a temperature at which the graded region is grown as the Ge concentration increases in the graded region.

5. The method of claim 4, wherein the step of incorporating compressive strain comprises growing alloys of $Ge_xSi_{1-x}$ from x=0 to about x≈35% at 750° C., growing alloys from x=35 to about x≈75% at between 650° C. and 750° C., and growing alloys greater than 75% at 550° C.

* * * * *